US010039213B1

(12) United States Patent
Norton et al.

(10) Patent No.: US 10,039,213 B1
(45) Date of Patent: Jul. 31, 2018

(54) AIR INLET CHANNEL WITH THERMOELECTRIC COOLING ELEMENT

(71) Applicant: HEWLETT PACKARD ENTERPRISE DEVELOPMENT LP, Houston, TX (US)

(72) Inventors: John Norton, Houston, TX (US); Kevin Leigh, Houston, TX (US); Peter Lieber, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/405,831

(22) Filed: Jan. 13, 2017

(51) Int. Cl.
| H05K 7/20 | (2006.01) |
| H05K 1/18 | (2006.01) |
| H05K 7/14 | (2006.01) |
| G02B 6/42 | (2006.01) |
| F25B 21/02 | (2006.01) |

(52) U.S. Cl.
CPC ......... H05K 7/20836 (2013.01); F25B 21/02 (2013.01); G02B 6/4268 (2013.01); H05K 1/181 (2013.01); H05K 7/1427 (2013.01); H05K 7/20145 (2013.01); H05K 7/20154 (2013.01); H05K 7/20209 (2013.01); H05K 7/20727 (2013.01); F25B 2321/0212 (2013.01); F25B 2321/0251 (2013.01); H05K 2201/10121 (2013.01)

(58) Field of Classification Search
None
See application file for complete search history.

(56) References Cited

U.S. PATENT DOCUMENTS

| 5,524,439 | A | * | 6/1996 | Gallup | A47C 7/74 62/261 |
| 7,722,359 | B1 | * | 5/2010 | Frangioso, Jr. | H05K 7/20563 361/679.48 |
| 2004/0008487 | A1 | * | 1/2004 | Hisano | H05K 7/20254 361/690 |
| 2008/0031574 | A1 | * | 2/2008 | Tanaka | G02B 6/4246 385/88 |

* cited by examiner

*Primary Examiner* — Dimary Lopez Cruz
*Assistant Examiner* — Zhengfu Feng
(74) *Attorney, Agent, or Firm* — Hewlett Packard Enterprise Patent Department

(57) ABSTRACT

An example electronic device may include a chassis, a circuit board in the chassis that includes a first active component, a number of fans, a number of guide walls that define an air inlet channel, and a thermoelectric cooler (TEC). There may be an airflow path such that, when the fans operate, air flows along the airflow path from an intake opening of the air inlet channel to an exhaust of the chassis, with the first active component being located in the airflow path downstream of the intake opening of the air inlet channel. A cold portion of the TEC may extend into the airflow path upstream of the first active component and a hot portion of the TEC may extend into the airflow path downstream of the first active component.

18 Claims, 6 Drawing Sheets

AIR INLET CHANNEL WITH THERMOELECTRIC COOLING ELEMENT

BACKGROUND

Electronic devices, such as servers, may include components that are sensitive to heat. One approach to cooling such components includes causing air to flow over the component, for example via a fan.

DETAILED DESCRIPTION

Figure 1:
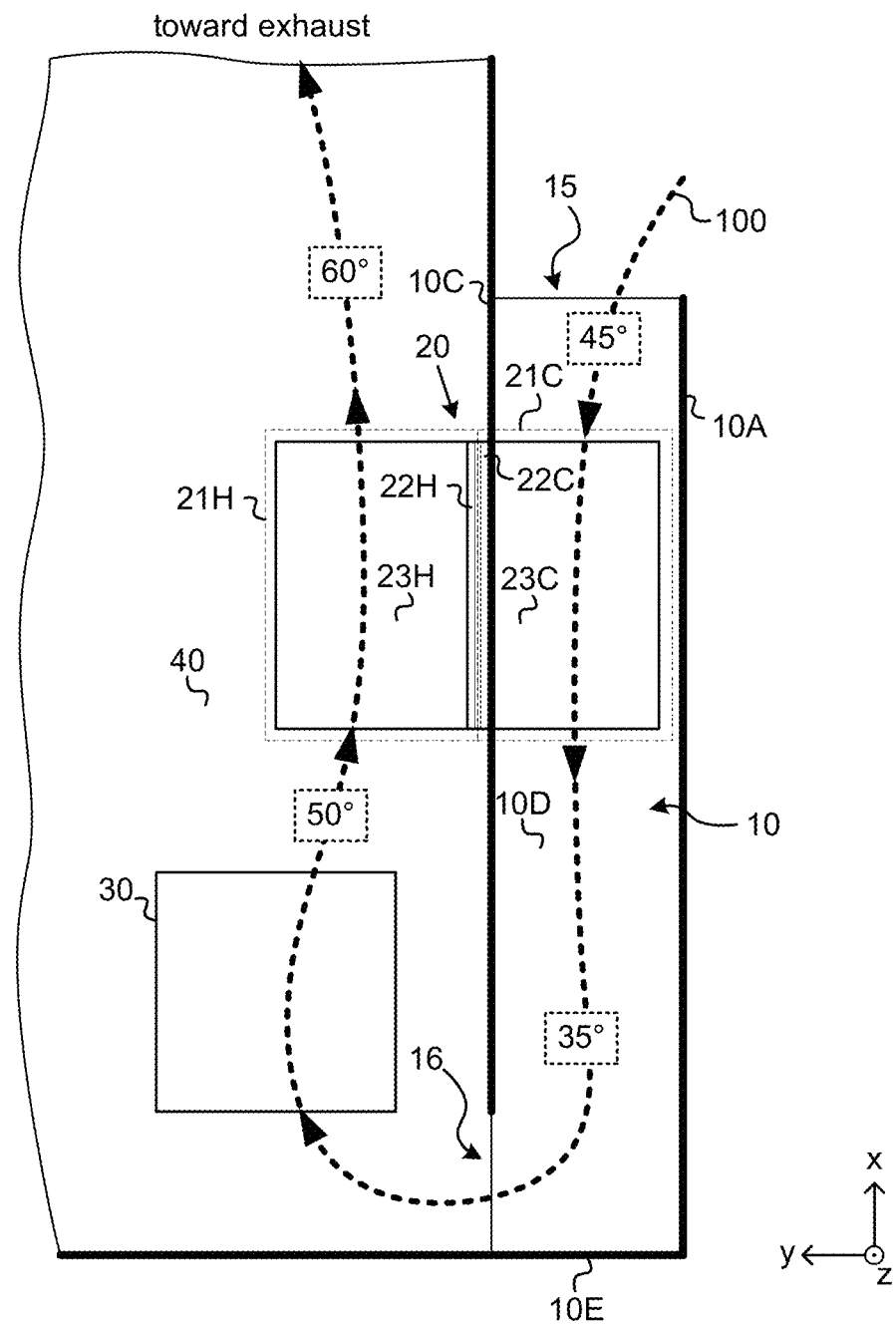
FIG. 1 illustrates, in plan view, a portion of an example electronic device that includes an air inlet channel, a thermoelectric cooler, and a heat-sensitive component.

In certain example electronic devices described herein, an airflow path is arranged so as to cool a heat-sensitive component, and a thermoelectric cooler (TEC) is placed in the airflow path such that a cool side of the TEC is in the airflow path upstream of the heat-sensitive component and a hot side of the TEC is in the airflow path downstream of the heat-sensitive component. Because of the location and arrangement of the TEC, the TEC may draw heat out of (i.e., cool) the air in the airflow path upstream of the heat-sensitive component, and may release heat into (i.e., heat) the air in the airflow path downstream of the heat-sensitive component. Thus, the air in the airflow path may be cooler when it reaches the heat-sensitive component than it otherwise would have been without the TEC, and therefore the air may be able to better cool the heat-sensitive component. This example technique of using the TEC to cool air in the airflow path upstream of the heat-sensitive component may be referred to herein as "pre-cooling."

In certain examples, the airflow path may flow to the heat-sensitive component via an air inlet channel formed by a number of guide walls, and the TEC may be arranged such that the cool side thereof extends into the air inlet channel. In certain examples, the air flow path may flow over the cool side of the TEC in one direction, reverse directions downstream of the cool side of the TEC, and then flow over the hot side of the TEC in a second direction that is opposite of the first direction.

Pre-cooling may be particularly beneficial when, for example, the air that is upstream of the heat-sensitive component is too hot to satisfactorily cool the heat-sensitive component. For example, other devices and/or other components within the same device as the heat-sensitive component may heat the air upstream of the heat-sensitive component such that it is too hot to satisfactorily cool the heat-sensitive component. As another example, the ambient air itself may be too hot to satisfactorily cool the heat-sensitive component even without being pre-heated by other components within the device.

For example, pre-cooling may be particularly beneficial in an example electronic device in which a number of first components (e.g., compute modules, storage modules, server blades, etc.) and a number of second components (e.g., networking modules) are arranged in the same chassis, with the first components being upstream of the second components in an airflow path for cooling the components. For example, certain blade server enclosures may adopt such a configuration, with hot-pluggable blades being housed in a front of the chassis, networking modules being housed in a rear of the chassis, a mid-plane connecting the front and rear components, and fans to cause air to flow through the chassis. In such an example system, without the pre-cooling described above, the first components may heat the air in the airflow path such that it is too hot to adequately cool the second components. However, by using the example pre-cooling techniques described above to cool the air at a location in the airflow path that is downstream of the first components and upstream of the second components, the air that impinges on the second components may be made cool enough to satisfactorily cool the second components.

Figure 2:
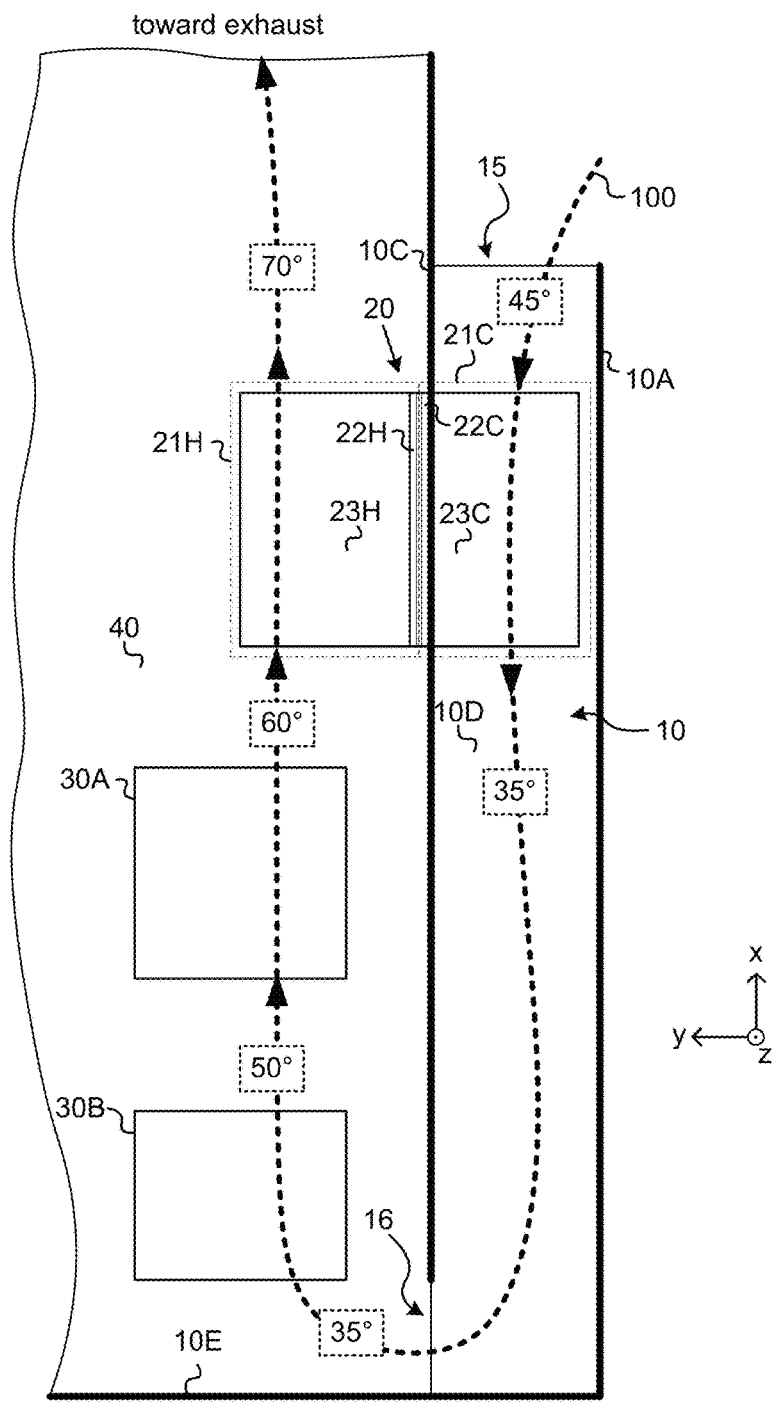
FIG. 2 illustrates, in plan view, a portion of another example electronic device that includes an air inlet channel, a thermoelectric cooler, and two heat-sensitive components.
Figure 3:
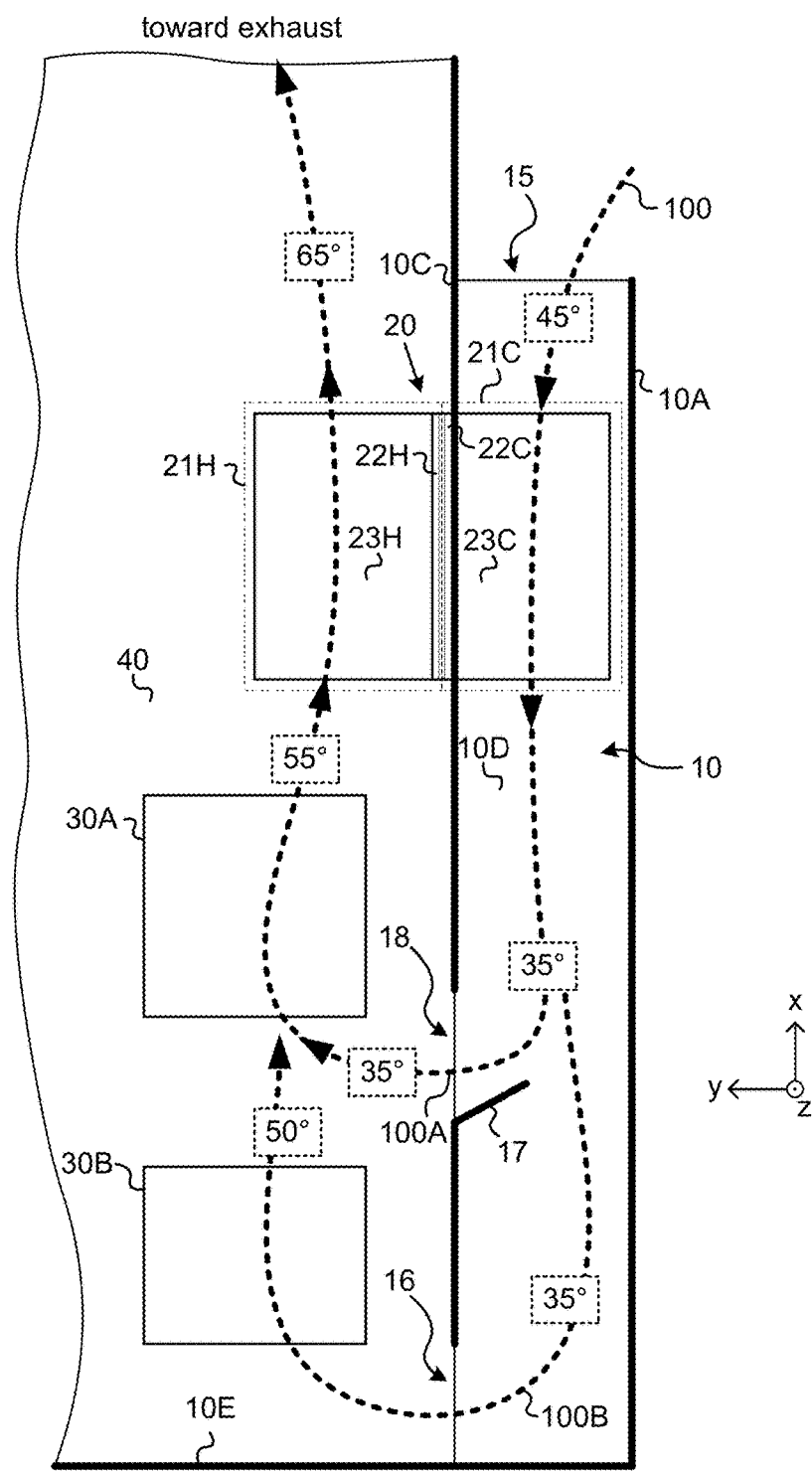
FIG. 3 illustrates, in plan view, a portion of another example electronic device that includes an air inlet channel with two exit openings, a thermoelectric cooler, and two heat-sensitive components.
Figure 4:
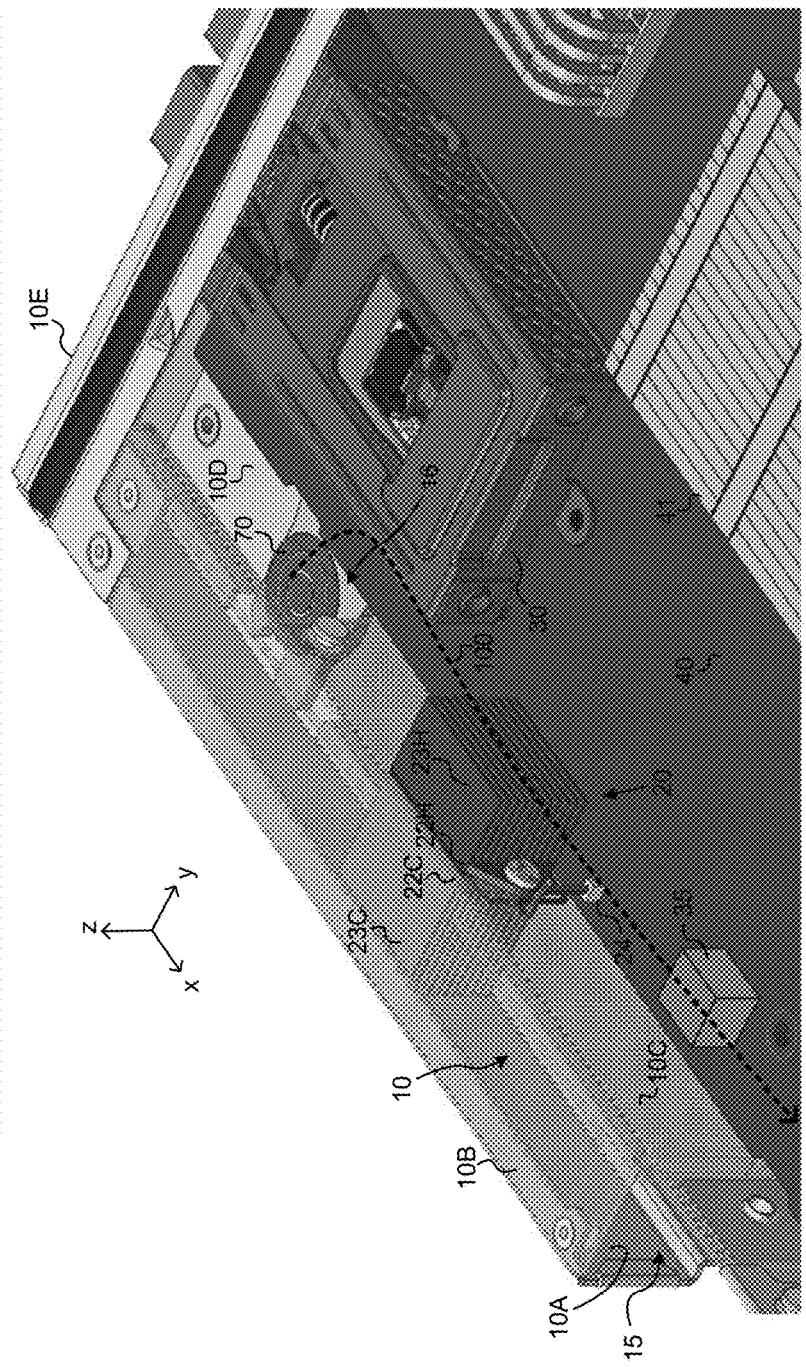
FIG. 4 illustrates, in perspective view, a portion of another example electronic device that includes an air inlet channel, a thermoelectric cooler, and a heat-sensitive component.

FIGS. 1-4 illustrate an example electronic device implementing an example of the above-described pre-cooling techniques. FIG. 1 is a block-diagram illustrating features of the example electronic device in a plan view. FIGS. 2 and 3 are block diagrams illustrating, in a plan view, variations on the features shown FIG. 1. FIG. 4 is a perspective view of a specific implementation example of the features shown in FIG. 1. Certain features are illustrated in multiple ones of the figures, but such features will be described once herein to avoid duplicative descriptions.

Figure 5:
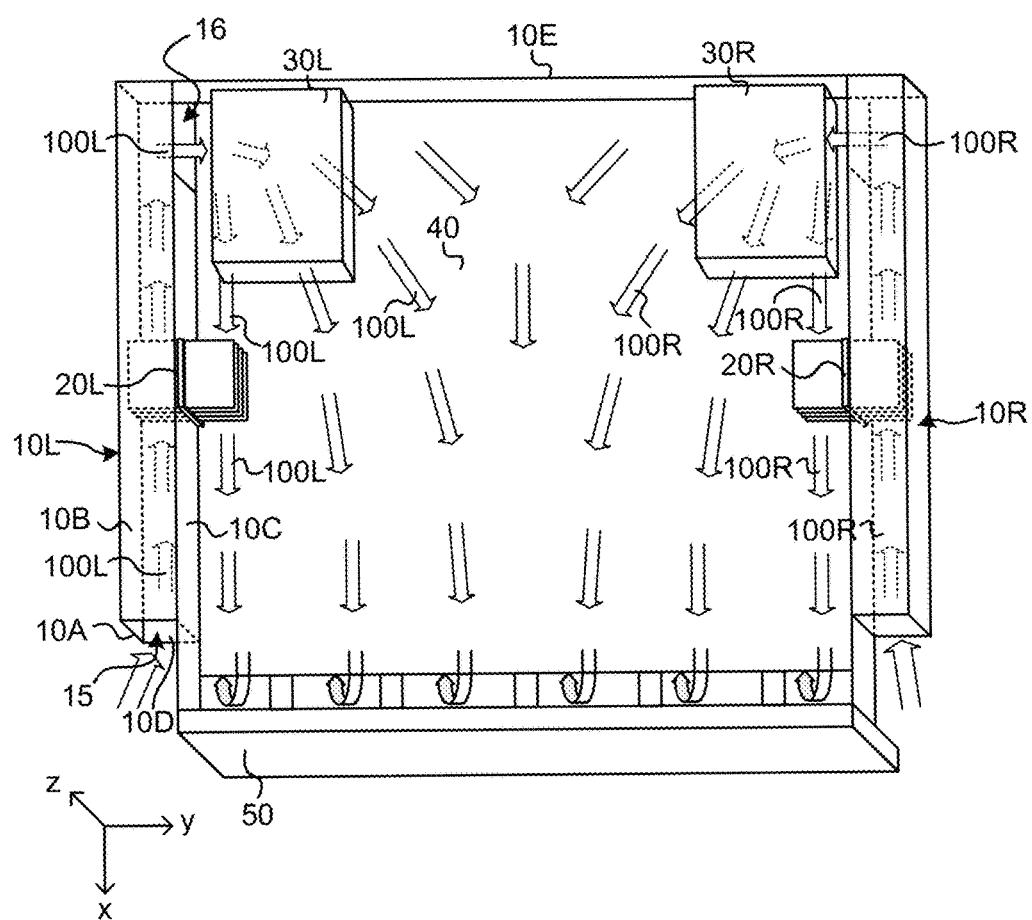
FIG. 5 illustrates, in perspective view, a portion of another example electronic device that includes a circuit board connected to a midplane, together with airflow paths.

In FIGS. 1-3, certain features (such as the guide wall 10B) are not illustrated so as to avoid obstructing the view of certain other features. In FIG. 5, the guide walls 10B and 10C are made semi-transparent to show the interior of the air inlet channel 10. In FIGS. 1-4, certain features (such as additional electronic components on the circuit board 40) are not shown to reduce the complexity of the illustration and ease of understanding.

The electronic device includes a circuit board 40 that has a heat-sensitive component 30 thereon, a number of guide walls 10A-E that define an air inlet channel 10, and a TEC 20. The electronic device may also include fans 60 (not shown in FIGS. 1-4) and a chassis 90 (not shown in FIGS. 1-4) that houses the circuit board 40.

The electronic device is configured such that, when the fans 60 operate, air flows along an airflow path 100. Specifically, air flows along the airflow path 100 from an inlet opening 15 of the air inlet channel 10 toward an exhaust of the device. The airflow path 100 flows: into the air inlet channel 10 via the inlet opening 15, past a cold portion 21C of the TEC 20 in the air inlet channel 10, out an exit opening 16 of the air inlet channel 10, past the heat-sensitive component 30, past a hot portion 21H of the TEC 20, and then toward the exhaust. The airflow path 100 flows in a first direction through the air inlet channel 10 (e.g., the −x direction in FIGS. 1-4), and the reverses directions after exiting the exit opening 16 to flow in a second direction (e.g., the +x direction in FIGS. 1-4) over the circuit board 40.

Thus, both the cold portion 21C and the hot portions 21B of the TEC 20 extend into the airflow path 100, but at different locations within the airflow path—specifically, the cold portion 21C extends into the airflow path 100 upstream of the heat-sensitive component 30 while the hot portion 21H extends into the airflow path 100 downstream of the heat-sensitive component 30.

As noted above, the TEC 20 may have a cold portion 21C and a hot portion 21H, which are joined together. The cold portion 21C may include a cold plate 22C (shown as parallel to the x-z plane in FIG. 1) and a number of fins 23C extending perpendicularly outward from the cold plate 22C. The hot portion 21H may include a hot plate 22H (shown as parallel to the x-z plane in FIG. 1) and a number of fins 23H extending perpendicularly outward from the hot plate 22H. The TEC 20 may use electrical energy to transfer heat from the cold plate 22C to the hot plate 22H. Thus, when the TEC 20 is operating, the cold portion 21C becomes cold and the hot portion 21H becomes hot. In certain examples, an electrical connector 24 of the TEC 20 may be plugged into the circuit board 40, as illustrated in FIG. 4.

A portion of the TEC 20 may extend through a hole in the guide wall 10C such that at least part of the fins 23C are in the air inlet channel 10 and at least part of the fins 23H extend over the circuit board 40. For example, the cold plate 22C may be disposed on the +y side of the guide wall 100 and the fins 23C may extend from the cold place 22C in the −y direction through the hole in the guide wall 100. As another example, the cold plate 22C may extend through the hole in the guide wall 100 (i.e., the cold plate 22C may be disposed in the hole in the guide wall 100). As another example, the cold plate 22C may be disposed within the air inlet channel 10 (i.e., on the −y side of the guide wall 100), and a middle portion of the TEC 20 (and/or the hot plate 22H) may extend through hole in the guide wall 100. The TEC 20 may be secured on the guide wall 100, for example, by mounting screws.

Because the cold portion 21C extends into the airflow path 100 upstream of the heat-sensitive component 30 and is colder than the air at that point, the cold portion 21C absorbs heat from the air in the airflow path 100, thus cooling the air upstream of the heat-sensitive component 30. Similarly, because the hot portion 21H extends into the airflow path 100 downstream of the heat-sensitive component 30 and is hotter than the air at that point, the hot portion 21H releases heat into the air in the airflow path 100, thus heating the air downstream of the heat-sensitive component 30. FIGS. 1-3 illustrate these phenomenon by showing the cold portion 21C lowering the temperature of the air in the airflow path 100 by 10° upstream of the heat-sensitive component and by showing the hot portion 21H raising the temperature of the air in the airflow path by 10° downstream of the heat-sensitive component 30. However the temperatures shown in FIGS. 1-3 are merely for purposes of illustration and are not intended to be exact—in practice, the cold portion 21C and the hot portion 21H may lower and raise the temperature of the air more or less than what is shown. The actual amount that the air is cooled and heated by the TEC 20 will vary depending on, among other things, the respective temperatures of the cold portion 21C and the hot portion 21H, the respective temperatures of the air when it reaches the cold portion 21C and the hot portion 21H, and the design parameters of the TEC 20 (e.g., the surface areas of the cold plate 22C and the hot plate 22H, surface materials used, thermoelectric efficiency, amount of electrical power supplied to the TEC, etc.).

The TEC 20 may be formed from device that uses electrical energy to transfer heat from one side of the device (e.g., the cold plate 22C) to the other side of the device (e.g., the hot plate 22H). For example, the TEC 20 may use the thermoelectric effect (Peltier effect) to create a heat flux at a junction of two different materials. In particular, any commercially available TEC may be used as the TEC 20. TECs may also be referred to occasionally as Peltier devices, Peltier heat pumps, and solid state refrigerators, and any such device may be used as the TEC 20.

The example TEC 20 described above and illustrated in FIGS. 1-5 has multiple fins 23C/23H that are used as heat exchangers to improve the efficiency of heat exchange between the TEC 20 and the air in the airflow path. However, the fins 23C/23H could be configured differently than how they are shown in FIGS. 1-5—for example, the fins 23C/23H may be flared, more or fewer fins may be included, etc. In some examples, the fins 23C/23H may be shaped to direct the airflow path 100 in certain direction. Moreover, other structures may be used as heat exchangers, in addition to or in lieu of the fins; for example, pins, coils, lattices, or other structures may be used as heat exchangers. In addition, in certain examples the TEC 20 may have no heat exchanging structures (such as the fins 23C/23H) attached to the cold plate 22C and the hot plate 22H, in which case the cold plate 22C and the hot plate 22H may serve as the primary mechanisms of heat exchange between the TEC 20 and the air of the airflow path 100.

The heat-sensitive component 30 may be any active electrical component, such as, for example, a processor, a memory, an application-specific-integrated-circuit (ASIC), an optical interconnect module (or component thereof), etc. For example, FIG. 4 illustrates one specific implementation example in which the heat-sensitive component 30 is an optical interconnect module that includes an optical transceiver. The heat-sensitive component 30 is an example of the "first active component" recited in several of the appended claims.

The circuit board 40 may include other electronic components (not illustrated) in addition to the heat-sensitive component 30. These other electronic components may also be cooled by the airflow path 100, or they may be cooled by other airflow paths—in other words, the airflow path 100 need not be the only airflow path in the example device. For example, there may be additional electronic components 35 in the airflow path 100 that are downstream of the hot portion 21H (see FIG. 4); such electronic components 35 may be, for example, components that produce less heat or have a higher heat tolerance than the heat-sensitive component 30. Moreover, in certain examples there may be multiple electronic components located in the airflow path 100 between the cold portion 21C and the hot portion 21H.

For example, FIGS. 2 and 3 illustrate examples in which there are two heat-sensitive components 30A and 30B in the airflow path 100 between the cold portion 21C and the hot portion 21H. Certain features illustrated in FIGS. 2 and 3 are similar to features illustrated in FIG. 1, and duplicative description of such corresponding features is omitted.

In FIG. 2, the heat-sensitive components 30A and 30B are located in the airflow path 100 downstream of the cold portion 21C of the TEC 20 and upstream of the hot portion 21H of the TEC 20. The airflow path 100 passes the heat-sensitive component 30B and absorbs heat therefrom and then passes the heat-sensitive component 30A and absorbs heat therefrom. Thus the air in the airflow path 100 is at the pre-cooled temperature (e.g., 35° in FIG. 2) when it meets the heat-sensitive component 30B, but is at a higher temperature (e.g., 50° in FIG. 2) when it meets the heat-sensitive component 30A.

The arrangement of the example device in FIG. 3 is similar to the arrangement shown in FIG. 2, except that in FIG. 3 there are two exit openings in the air inlet channel 10—the exit opening 18 and the exit opening 16—each corresponding to one of the heat-sensitive components 30A and 30B, respectively. This allows some of the air flowing through the air inlet channel 10 to follow a first branch 100A of the airflow path 100 while some of the air flowing through the air inlet channel 10 follows a second branch 100B of the airflow path 100. The first branch 100A may flow to the heat-sensitive component 30A, while the second branch 100B may flow to the heat-sensitive component 30B. The first branch 100A and the second branch 100B may recombine upstream of or at the heat-sensitive component 30A. In certain examples, a baffle 17 may be included to redirect some of the air in the airflow path 100 along the branch 100A while allowing some of the air in the airflow path 100 to continue along the branch 100B. In certain examples, the first branch 100A and the second branch 100B of the airflow path 100 may be caused at least in part by the fins 230; for example, the fins 23C may be shaped to direct some of the air along the first branch 100A (i.e., direct the air towards the baffle 17 and/or the opening 18) and to direct some of the air along the second branch 100B (i.e., direct the air towards the opening 16).

By directing some air that is at the pre-cooled temperature (e.g., 35° in FIG. 3) toward the heat-sensitive component 30A without it first passing over the heat-sensitive component 30B, the effective temperature of the air at the heat-sensitive component 30A is lower in the arrangement of FIG. 3 than it is in the arrangement of FIG. 2. In particular, while the air that follows branch 100B is the same temperature after it passes the heat-sensitive component 30B in both FIGS. 2 and 3 (e.g., 50°), because in the arrangement of FIG. 3 this hotter air is combined with cooler air from the first branch 100A at or before the heat-sensitive component 30A, the effective combined temperature of the air at the heat-sensitive component 30A is lower.

In FIGS. 1-4, an example of the air inlet channel 10 is illustrated as having a shape roughly like a cuboid, but the air inlet channel 10 may have any shape. Moreover, the shapes and locations of the TEC 20 and the heat-sensitive component(s) 30 in FIGS. 1-4 are not meant to be exact, and the actual shapes and locations may differ from what is illustrated. In certain examples, one or more of the guide walls 10A-10E may be formed by a wall of the chassis 90 of the device. For example, the guide wall 10A and/or the guide wall 10E may be formed by the chassis 90. In certain examples, the guide walls 10A-E that define the air inlet channel 10 may perform other functions as well, such as, for example, connecting the circuit board 40 to the chassis 90. For example, in FIG. 4 a connector 70 is illustrated within the air inlet channel 10 that is to latch the circuit board 40 to the chassis 90.

Figure 6:
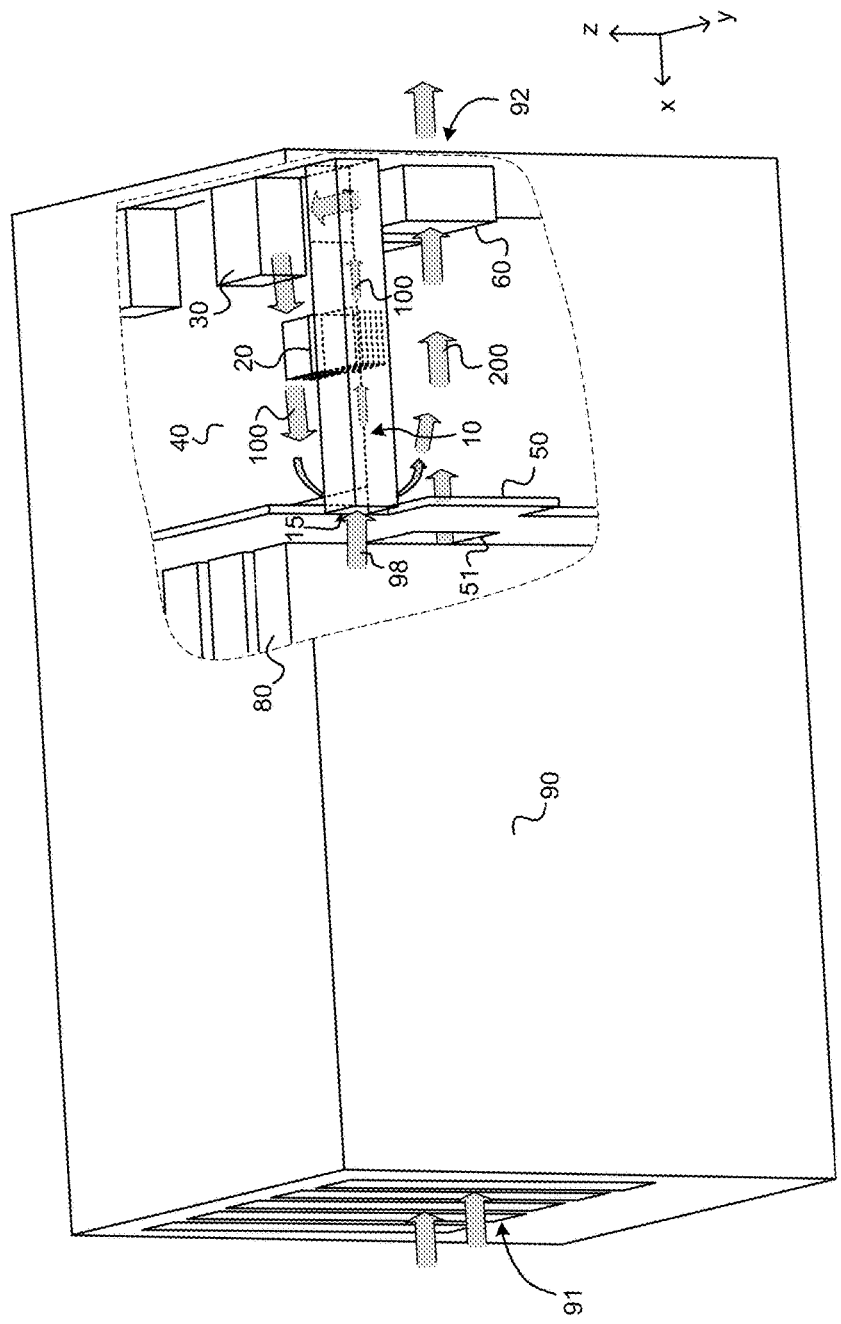
FIG. 6 illustrates, in perspective view, another example electronic device with a cut-away to reveal a circuit board connected to a midplane and airflow paths.

The airflow path 100 illustrated in FIGS. 1-3 may be a portion of a larger airflow path that may extend from an inlet of the chassis 90 of the example device to an exhaust of the chassis 90 of the example device. This larger airflow path may follow any number of possible paths outside the region illustrated in FIGS. 1-3, and any such path is acceptable as long as the path behaves in the manner described above in the region near the TEC 20 and the heat-sensitive component 30. Specially, any larger airflow path is acceptable if, when the fans 60 are operating, air flows at least: into the air inlet channel 10, then past a cold portion 21C of the TEC 20 in the air inlet channel 10, then out an exit opening 16 of the air inlet channel 10, then past the heat-sensitive component 30, and then past a hot portion 21H of the TEC 20. FIGS. 5 and 6 illustrate specific non-limiting examples of such larger airflow paths.

FIGS. 5 and 6 illustrate an example electronic device in perspective views. Specifically, FIG. 5 illustrates a portion of the electronic device corresponding to the circuit board 40, while FIG. 6 illustrates a chassis 90 of the example electronic device with a cut-away portion to show how various features including the circuit board 40 may be situated within the chassis 90.

The example device illustrated in FIGS. 5 and 6 includes features similar to those described in relation to FIG. 1, and duplicative description of these features is omitted. In particular, the device illustrated in FIGS. 5 and 6 is a more detailed example of the device illustrated in FIG. 1. In other words, FIGS. 5 and 6 illustrate both the features shown in FIG. 1 and additional features pertaining to a broader context in which the features of FIG. 1 may be implemented. It should be understood that the broader context illustrated in FIGS. 5 and 6 is merely one example of a context in which the features of FIG. 1 may be implemented.

In the example device illustrated in FIGS. 5 and 6, the circuit board 40 may have two of each of the features that were described above in relation to FIG. 1, one for each of the right and left sides of the circuit board 40. Specifically, an air inlet channel 10L is provided on the left side of the circuit board 40 and an air inlet channel 10R is provided on the right side of the circuit board. The air inlet channel 10L may provide air via an airflow path 100L to cool a heat-sensitive component 30L that is located on a left-rear side of the circuit board 40, while the air inlet channel 10R may provide air via an airflow path 100R to cool a heat-sensitive component 30R that is located on a right-rear side of the circuit board 40. TECs 20L/R are connected to the air inlet channels 10L/R in the manner described above. Portions of the airflow paths 100L and 100R may mix together eventually, for example near a middle region of the circuit board 40.

In the example device illustrated in FIGS. 5 and 6, the circuit board 40 is coupled to a midplane 50. The midplane 50 may be to, for example, couple additional electronic components 80 to the circuit board 40. Each of the electronic components 80 may include a circuit board that has a number of active components, such as CPUs, memory, ASICs, etc. For example, the electronic components 80 may be server blades, compute modules, storage modules, etc. The electronic components 80 are examples of the "second circuit board(s)" or "front-end circuit board(s)" referred to in several of the appended claims. The circuit board 40 may be, for example, a networking module, such as a switch module.

In certain examples, the midplane 50 may connect to the electronic components 80 in such a manner that the components 80 may be hot-pluggable (hot-swappable). In certain examples, the midplane 50 may also connect to the circuit board 40 in such a manner that the circuit board 40 is hot-pluggable (hot-swappable). There may be multiple circuit boards (including the circuit board 40) in a rear portion of the chassis that are connected to the midplane 50, and some or all of these circuit boards may include an air inlet channel 10 and TEC 20 in the manner described above. Such circuit boards in a rear portion of the chassis that are connected to the midplane 50 (including the circuit board 40) are examples of the "back-end circuit board(s)" recited in several of the claims. The circuit board 40 in particular may be referred to as the "circuit board" of the "first circuit board" in several of the claims.

As illustrated in FIGS. 5 and 6, there may be air gaps between the midplane 50 and the circuit board 40. The fans 60 may be positioned so as to cause a region below a front portion of the circuit board 40 to have lower pressure than a region above the front portion of the circuit board 40. This pressure differential may cause air to flow in the directions indicated by the arrows in FIG. 5. In particular, this pressure difference causes a pressure gradient between the inlets 15 of the air inlet channels 10L/10R and the air gaps, resulting in air being sucked through the air inlet channels 10L/10R, over the circuit board 40 from rear toward the front, and then down through the air gaps. When air flows in this manner, the airflow path 100 is formed (among other airflow paths).

For example, the pressure difference describe above may be created by positioning the fans 60 such that there is an airflow path, such as the airflow path 200 illustrated in FIG. 6, that flows below the circuit board 40 in the −x direction. For example, in FIG. 6 an exhaust 92 of the chassis 90 is located at a rear of the chassis 90 and the fans 60 are positioned adjacent to the exhaust 92 so as to blow out of the chassis 90. However, this is merely one example configuration that is capable of forming the airflow path 100.

When the fans 60 are configured as illustrated in FIG. 6, air may flow through the chassis 90 generally from front to back, entering the chassis 90 via inlet openings 91 in the front of the chassis 90 and exiting the chassis 90 via the exhaust 92. The air may cool the additional electrical components 80 (i.e., the electrical components 80 may heat the air) before the air passes the midplane 50. A main portion of the air that is heated by the electrical components 80 passes to the rear of the chassis through the openings 51 following an airflow path 200. In addition, some of the air that is heated by the electrical components 80 may flow along side channels between a side of the chassis 90 and the electrical components 80 and become inlet air 98 that is drawn into the air inlet channel 10 along the airflow path 100.

As noted above, the inlet air 98 may be heated by the electrical components 80 prior to reaching a rear part of the chassis 90. The temperature of the inlet air 98 prior to reaching the TECs 20 may be too high to adequately cool the heat-sensitive components 30. However, because the TECs 20 are provided in the air inlet channels 10L/R in the manner described above, the hot inlet air 98 may be pre-cooled prior to reaching the heat-sensitive components 30 to a temperature that is low enough to adequately cool the heat-sensitive components 30.

As illustrated in FIG. 6, there may be openings 51 in the midplane 50 to facilitate passage of air from the front of the chassis toward the rear—in particular, the airflow path 200 may start at such an opening 51. (Details of the midplane 50, such as the aforementioned openings 51, are omitted from FIG. 5 for ease of illustration).

In certain examples, the TEC 20, the heat-sensitive component 30, and/or the circuit board 40 may include a temperature sensor that senses a temperature in the chassis 90. For example, the heat-sensitive component 30 may include the temperature sensor and may sense the temperature of a portion of the heat-sensitive component 30, and/or the temperature of air flowing over the heat-sensitive component 30. As another example, the TEC 20 may include the temperature sensor and may sense the temperature of its cold portion 21C (or hot portion 21H). Furthermore, in these examples the circuit board 40 may include a controller 41 (such as a CPU, an ASIC, etc.) that is to supply power to the TEC 20 via the electrical connector 24. The controller 41 may receive the sensed temperature from the temperature sensor, and may adjust an operating mode of the TEC 20 based on the sensed temperature. For example, the controller 41 may turn the TEC 20 off if the sensed temperature is below a threshold value and may turn the TEC 20 on if the sensed temperature passes the threshold value. As another example, the TEC 20 may have various discrete levels of operations (e.g., low, medium, high, etc.) and the controller 41 may associate temperature ranges with each such level of operation and may control the TEC 20 to operate according to which temperature range the sensed temperature falls in. As another example, the TEC 20 may be able to vary its operating mode continuously (e.g., by continuously varying an analog supply voltage), in which case the controller 41 may set the supply voltage based on the sensed temperature according to a specified functional relationship.

Herein, airflow paths (such as the airflow paths 100 and 200) are illustrated by way of arrows and lines for ease of description. However, these representations are not intended to be exact, and they should not be interpreted to imply that the airflow paths follow a line or a curve. In fact, an airflow path is not a line or a curve, which has finite (or infinite) extension but infinitesimal width. Instead, an airflow path may fill a three-dimensional volume of space. Each airflow path is associated with an inlet opening, and indicates where air flowing through that inlet opening would go if the fans 60 were operative. Specifically, as used herein an airflow path is the course between a specific inlet opening and one or more outlet openings along which inlet air would tend to flow if the fans 60 were operative. More specifically, an airflow path may include any point through which any portion of the inlet air would flow as it flows between the correspond inlet opening and an outlet openings, together with the direction of flow at that point. In other words, the airflow path may be considered as a vector field in a three-dimensional volume, where the volume encompasses all points through which air might flow and each vector indicates a direction of the airflow at that point in the volume. An airflow path is defined by the geometry of the various solid components of the device (e.g., guide walls, circuit boards, etc.), the locations of inlet openings and exhaust openings, and the locations and orientations of fans. Specifically, the airflow path 100 may include all of the points though which any portion of the air inlet via the opening 15 may travers as it flows between the opening 15 and the openings between the circuit board 40 and the midplane 50. An airflow path may include multiple sub-paths, since different portions of the inlet air may traverse different paths.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of processors, wherein the processors . . . " could encompass both one processor and multiple processors, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form for grammatical consistency, but this does not necessarily mean that only one items is being referred to. Thus, for example, a phrase such as "a processor, wherein the processor . . . " could encompass both one processor and multiple processors, notwithstanding the use of the singular form.

Occasionally the phrase "and/or" is used herein in conjunction with a list of items. This phrase means that any combination of items in the list—from a single item to all of the items and any permutation in between—may be included. Thus, for example, "A, B, and/or C" may include any one of: {A}, {B}, {C}, {A, B}, {A, C}, {C, B}, and {A, C, B}.

While the above disclosure has been shown and described with reference to the foregoing examples, it should be understood that other forms, details, and implementations may be made without departing from the spirit and scope of this disclosure.

What is claimed is:

1. An electronic device comprising:
a chassis;
a circuit board in the chassis that includes a first active component and a second active component;
a number of fans;
a number of guide walls that define an air inlet channel; and
a thermoelectric cooler (TEC),
wherein there is airflow path such that, when the fans operate, air flows along the airflow path from an intake opening of the air inlet channel to an exhaust of the chassis, the first active component being located in the airflow path downstream of the intake opening of the air inlet channel,
wherein a cold portion of the TEC extends into the airflow path upstream of the first active component and a hot portion of the TEC extends into the airflow path downstream of the first active component, and
wherein the second active component is located in the airflow path downstream of the hot portion of the TEC.

2. The electronic device of claim 1,
wherein the TEC is connected to one of the guide walls such that the cold portion of the TEC extends into the air inlet channel.

3. The electronic device of claim 1,
wherein, when the fans operate, air flowing along the airflow path flows through the air inlet channel in a first direction and then flows in a second direction that is opposite the first direction after exiting the air inlet channel via an opening in one of the guide walls.

4. The electronic device of claim 1, further comprising:
a second circuit board that includes a second active component located upstream of the air inlet channel such that air heated by the second active component during operation flows into the air inlet channel when the fans operate.

5. The electronic device of claim 1, further comprising:
a number of front-end circuit boards;
a number of back-end circuit boards including the circuit board; and
a midplane connecting the front-end circuit boards to the back-end circuit boards,
wherein the intake opening of the air inlet channel is located such that air heated by the front-end circuit boards flows into the air inlet channel when the fans operate.

6. The electronic device of claim 5,
wherein the airflow path is such that, when the fans operate, air flowing along the airflow path:
flows rearward from a front side of the midplane through the air inlet channel, then
flows forward on a first side of the circuit board from an opening in the air inlet channel toward the midplane, where the first active component is disposed on the first side of the circuit board, then
flows upward or downward through a gap between the midplane and the circuit board, and then
flows rearward on a second side of the circuit board toward the exhaust of the chassis.

7. The electronic device of claim 1,
wherein the first active component is an optical transceiver.

8. The electronic device of claim 1, further comprising:
a temperature sensor,
wherein the circuit board includes a controller, which supplies power to the TEC, and
the controller is to adjust an operating mode of the TEC based on the temperature sensed by the temperature sensor.

9. The electrical device of claim 1,
wherein the circuit board includes an optical interconnect module.

10. An electronic device comprising:
a circuit board that includes a first active component;
a number of guide walls, wherein the guide walls are arranged such that, when the electronic device is installed in a chassis that includes a number of fans, an airflow path is formed such that, when the fans operate, air flowing along the airflow path that flows from an air inlet channel defined by the guide walls to an exhaust of the chassis, the first active component being located in the airflow path downstream of the air inlet channel and upstream of the exhaust;
a thermoelectric cooler (TEC) arranged such that a heat absorbing portion of the TEC extends into the airflow path upstream of the first component and a heat releasing portion of the TEC extends into the airflow path downstream of the first component,
wherein the electronic device, when installed in the chassis, is connected to a rear side of a midplane of the chassis such that, when the fans operate, air flowing along the airflow path:
flows rearward from a front side of the midplane through the air inlet channel, then
flows forward on a first side of the circuit board from an opening in the air inlet channel toward the midplane, where the first active component is disposed on the first side of the circuit board, then
flows upward or downward through a gap between the midplane and the circuit board, and then
flows rearward on a second side of the circuit board toward the exhaust of the chassis.

11. The electronic device of claim 10,
wherein the TEC is mounted on one of the guide walls such that the cold portion of the TEC extends into the air inlet channel through an opening in the guide wall.

12. The electronic device of claim 10,
wherein, when the fans operate, air flowing along the airflow path flows through the air inlet channel in a first direction and then flows in a second direction that is opposite the first direction after exiting the air inlet channel via an opening in one of the guide walls.

13. The electronic device of claim 10, further comprising:
a second active component located in the airflow path downstream of the first active component.

14. The electronic device of claim 10,
wherein the first active component is an optical transceiver and the electronic device is an interconnect module.

15. An electronic device comprising:
a chassis;
a number of front-end circuit boards;
a number of back-end circuit boards including a first circuit board that has a first active component disposed on a first side thereof;
a midplane connecting the front-end circuit boards to the back-end circuit boards;
a number of fans;
a number of guide walls; and
a thermoelectric cooling element (TEC),
wherein there is an airflow path such that air flowing along the airflow path when the fans operate:
flows rearward from a front side of the midplane through the air inlet channel, and then
flows forward on the first side of the circuit board from an opening in the air inlet channel toward the midplane,
wherein the first active component is disposed in the airflow path downstream of the air inlet channel, and
wherein a cold portion of the TEC extends into the airflow path upstream of the first active component and a hot portion of the TEC extends into the airflow path downstream of the first active component.

16. The electronic device of claim 15,
wherein air heated by the front-end circuit boards during operation flows into the air inlet channel when the fans operate.

17. The electronic device of claim 15,
wherein the first active component is an optical transceiver.

18. The electrical device of claim 15,
wherein the circuit board includes an optical interconnect module.

* * * * *